(12) United States Patent
Shibata et al.

(10) Patent No.: US 9,954,059 B1
(45) Date of Patent: Apr. 24, 2018

(54) SEMICONDUCTOR WAFER AND METHOD OF MANUFACTURING SEMICONDUCTOR ELEMENT

(71) Applicant: TOYOTA JIDOSHA KABUSHIKI KAISHA, Toyota-shi, Aichi (JP)

(72) Inventors: Hiroshi Shibata, Toyota (JP); Tatsuya Ito, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/681,696

(22) Filed: Aug. 21, 2017

(30) Foreign Application Priority Data

Oct. 7, 2016 (JP) .................. 2016-199483

(51) Int. Cl.
*H01L 23/58* (2006.01)
*H01L 29/06* (2006.01)
*H01L 21/304* (2006.01)

(52) U.S. Cl.
CPC ........ *H01L 29/0657* (2013.01); *H01L 21/304* (2013.01)

(58) Field of Classification Search
CPC ... H01L 21/304; H01L 21/3043; H01L 21/78; H01L 21/30604; H01L 21/302; H01L 29/0657; H01L 21/02013; H01L 21/02021; H01L 21/02035
See application file for complete search history.

(56) References Cited

U.S. PATENT DOCUMENTS

| 9,786,509 B2 * | 10/2017 | Nishihara | ............. H01L 21/304 |
| 2009/0020854 A1 * | 1/2009 | Feng | ................. H01L 21/02013 |
| | | | 257/619 |
| 2013/0052812 A1 * | 2/2013 | Nakata | ................. H01L 21/304 |
| | | | 438/514 |

FOREIGN PATENT DOCUMENTS

| JP | 2009-279661 A | 12/2009 |
| JP | 5266869 B2 | 8/2013 |
| JP | 5796412 B2 | 10/2015 |

* cited by examiner

*Primary Examiner* — Thanh Y Tran
(74) *Attorney, Agent, or Firm* — Oliff PLC

(57) ABSTRACT

A semiconductor wafer is provided with a thick region extending along its outer circumferential surface and being greater in thickness than its central region. A main surface of the wafer includes a slope surface located between the central region and the thick region. The slope surface has an inner circumferential edge and an outer circumferential edge, and slopes such that the thickness of the wafer increases from the inner circumferential edges to the outer circumferential edge. The slope surface includes an inner circumferential portion including the inner circumferential edge, an outer circumferential portion including the outer circumferential edge and an intermediate portion located between the inner and the outer circumferential portions. At least one of slope angles of the inner and the outer circumferential portions is smaller than a slope angle of the intermediate portion.

7 Claims, 6 Drawing Sheets

SEMICONDUCTOR WAFER AND METHOD OF MANUFACTURING SEMICONDUCTOR ELEMENT

TECHNICAL FIELD

An art disclosed herein relates to a semiconductor wafer and a method of manufacturing a semiconductor element.

BACKGROUND

Japanese Patent Application Publication No. 2009-279661 discloses a semiconductor wafer including a thick region with a greater thickness than that of its central region along its outer circumferential surface. Such a semiconductor wafer is a semi-finished product produced in a process of manufacturing a semiconductor element. In manufacturing of the semiconductor element, a semiconductor wafer having a uniform thickness is first prepared, and a partial structure of the semiconductor element is formed in its central region of the semiconductor wafer. Next, the central region of the semiconductor wafer is ground from one main surface side such that the semiconductor element has a desired thickness. At this occasion, in order to secure a strength of the semiconductor wafer, a region along the outer circumferential surface of the semiconductor wafer is left without being ground, and the semiconductor wafer having the above-mentioned thick region is thus manufactured. Thereafter, a remaining partial structure of the semiconductor element is formed in the central region of the semiconductor wafer, and the semiconductor wafer is diced such that individual semiconductor elements are cut out from the semiconductor wafer.

In the above-described semiconductor wafer, if the thickness of the semiconductor wafer is abruptly changed between the central region and the thick region, a high stress is likely to be generated at a boundary between the central region and the thick region, and the semiconductor wafer may be damaged. Regarding this point, in the semiconductor wafer described in Japanese Patent Application Publication No. 2009-279661, one or more slope surfaces are provided between the central region and the thick region, and the thickness of the semiconductor wafer is made to be gradually changed between the central region and the thick region.

SUMMARY

According to researches by the inventors of the present teachings, it was proved that a slope surface between a central region, and a thick region can suppress chipping of a semiconductor wafer, and an effect of suppressing the chipping increases as a slope angle of the slope surface becomes small. Further, it was also proved that the slope surface between the central region and the thick region could suppress residue of chemical solution used in a process of manufacturing a semiconductor element, and a higher effect could be obtained for suppressing the residue of chemical solution as the slope angle of the slope surface became smaller. However, as the slope angle of the slope surface is made smaller in order to enhance the above-mentioned effects, a width dimension of the slope surface (dimension of the slope surface in a radial direction of the semiconductor wafer) becomes wider, and an area in the central region or an area in the thick region decreases. As the area of the central region decreases, a number of semiconductor elements that can be manufactured from a single semiconductor wafer decreases. As the area of the thick-region decreases, the strength of the semiconductor wafer decreases. In the semiconductor wafer described in Japanese Patent Application. Publication No. 2009-279661, since the slope angle is constant on each of the slope surfaces, the above-mentioned trade-off problem cannot be solved.

It is an object of the present etchings to provide a technique that can solve such a trade-off problem at least partially.

According to further research by the present inventors, the chipping of the semiconductor wafer mainly occurs at an outer circumferential portion of the slope surface. Therefore, so long as a slope angle of the outer circumferential portion of the slope surface is made small, even if a slope angle of another portion of the slope surface is made relatively large, the chipping of the semiconductor wafer can be significantly suppressed. On the other hand, the residue of chemical solution may mainly occur at an inner circumferential portion of the slope surface. Accordingly, so long as the slope angle of the inner circumferential portion of the slope surface is made small, even if the slope angle of the other portion of the slope surface is made relatively large, the residue of the chemical solution can be significantly suppressed. In this way, the slope angle of the slope surface is made inconstant such that the slope angle of at least one of the outer circumferential portion and the inner circumferential portion is made smaller than the slope angle of an intermediate portion located therebetween, and thereby the width dimension of the slope surface can be suppressed from increasing and at least one of the above-mentioned effects due to the slope surface can be improved.

The present teachings disclose a semiconductor wafer based on the above-described findings. This semiconductor wafer may comprise a central region in a planer view and a thick region extending along an outer circumferential surface of the semiconductor wafer in the planer view, the thick region being greater in thickness than the central region. One of main surfaces of the semiconductor wafer may comprise a slope surface located between the central region and the thick region. The slope surface may comprises an inner circumferential edge located on a side of central region; and an outer circumferential edge located on a side of the thick region, and the slope surface slopes such that the thickness of the semiconductor wafer increases from the inner circumferential edge to the outer circumferential edge. The slope surface may comprise an inner circumferential portion including the inner circumferential edge, an outer circumferential portion including the outer circumferential edge, and an intermediate portion located between the inner circumferential portion and the outer circumferential portion. At least one of a slope angle of the inner circumferential portion and a slope angle of the outer circumferential portion may be smaller than a slope angle of the intermediate portion.

The semiconductor wafer disclosed herein is a semi-finished product produced in a process of manufacturing a semiconductor element. A method for manufacturing a semiconductor element may comprise: forming a partial structure of the semiconductor elements within a central portion of a semiconductor wafer in a planer view; forming a thick region that extends along an outer circumferential surface of the semiconductor wafer in the planer view by grinding the central portion from one of main surfaces of the semiconductor wafer, the thick region being greater in thickness than the central region; and forming another partial structure of the semiconductor element within the central portion of the semiconductor wafer from the one of the main surfaces of the semiconductor wafer. Further, in the forming of the thick region a slope surface having the above-described structure may further be formed between the central region and the thick region on the one of the main surfaces of the semiconductor wafer.

DETAILED DESCRIPTION

Figure 1:
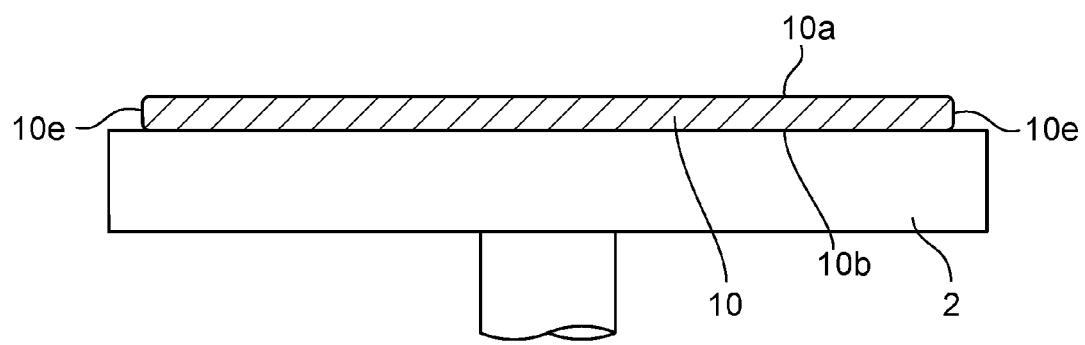
FIG. 1 is a view showing one step of a manufacturing method of a semiconductor element, showing a prepared semiconductor wafer 10.

In one embodiment of a semiconductor wafer, a slope angle of an outer circumferential portion of a slope surface may be smaller than a slope angle of an intermediate portion of the slope surface. According to this configuration, an effect of suppressing chippings by the slope surface can be enhanced while suppressing an increase in a width dimension of the slope surface.

In the above embodiment, the slope angle of the inner circumferential portion of the slope surface may be equal to the slope angle of the intermediate portion of the slope surface. According to this configuration, for example, since the inner circumferential portion and the intermediate portion can be formed of a same grindstone, manufacturing processes of the semiconductor element can be prevented from being complicated.

In another embodiment of the semiconductor wafer, the slope angle of the inner circumferential portion of the slope surface may be smaller than the slope angle of the intermediate portion of the slope surface. According to this configuration, an effect of suppressing residue of chemical solution by the slope surface can be enhanced while suppressing the increase in the width dimension of the slope surface.

In the above embodiment, the slope angle of the outer circumferential portion of the slope surface may be equal to the slope angle of the intermediate portion of the slope surface. According to this configuration, for example, since the outer circumferential portion and the intermediate portion can be formed by a same grindstone, manufacturing processes of the semiconductor element can be prevented from being complicated.

In another embodiment of the semiconductor wafer, the slope angle of both the outer circumferential portion and the inner circumferential portion of the slope surface may be smaller than the slope angle of the intermediate portion of the slope surface. According to this configuration, both of the effect of suppressing chippings by the slope surface and the effect of suppressing the residue of chemical solution by the slope surface can be enhanced while suppressing the increase in the width dimension of the slope surface.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor wafer, as well as methods for manufacturing semiconductor elements.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

A semiconductor wafer 10 of an embodiment will be described with reference to the drawings. The semiconductor wafer 10 is a semi-finished product produced in a process of manufacturing a semiconductor element. Thus, a method of manufacturing the semiconductor element will be described first, and the semiconductor wafer 10 will be described in detail thereafter. The semiconductor element to be manufactured is not particularly limited, however, it may include at least one of, for example, an IGBT (Insulated Gate Bipolar Transistor), a MOSFET (Metal-Oxide-Semiconductor Field-Effect Transistor), or a diode.

First, as shown in FIG. 1, the semiconductor wafer 10 is prepared. The semiconductor wafer 10 is placed on a stage 2. The semiconductor wafer 10 is constituted of a semiconductor material such as silicon (Si) or silicon carbide (SiC), for example. The semiconductor wafer 10 has a disk shape, and has a first main surface 10a, a second main surface 10b, and an outer circumferential surface 10e. The first main surface 10a and the second main surface 10b are planes parallel to each other, and each has a circular shape. The outer circumferential surface 10e is a cylindrically curved surface and extends between the first main surface 10a and the second main surface 10b. At this stage, the semiconductor wafer 10 has a constant thickness throughout its entirety. The semiconductor wafer 10 usually contains n-type or p-type conductive impurities.

Figure 2:
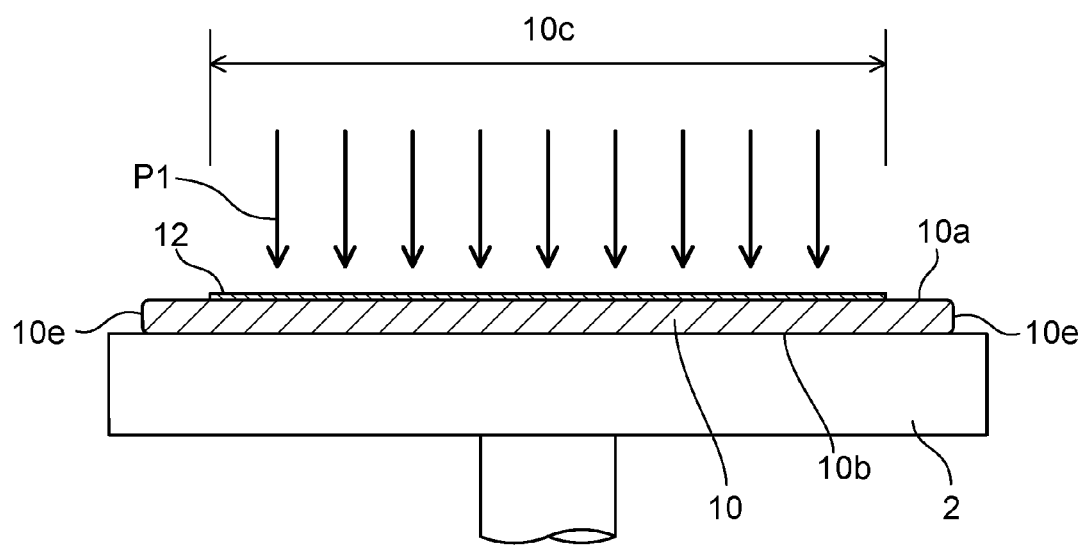
FIG. 2 is a view showing one step of the manufacturing method of the semiconductor element, and showing how a partial structure of the semiconductor element is formed from a first main surface 10a side of the semiconductor wafer 10.

Next, as shown in FIG. 2, a partial structure of the semiconductor element is formed in a central region 10c of the semiconductor wafer 10. In this step, for example, ion implantation of n-type or p-type conductive impurities and formation of a first electrode layer 12 to serve as a main electrode of the semiconductor element are performed mainly from a first main surface 10a side of the semiconductor wafer 10. It should be noted that specific processes performed in this step are not particularly limited, and necessary processes may be performed according to the structure of the semiconductor element. Arrows P1 in FIG. 2 schematically show various kinds of processes that can be performed in this step, and do not indicate any specific process.

Figure 3:
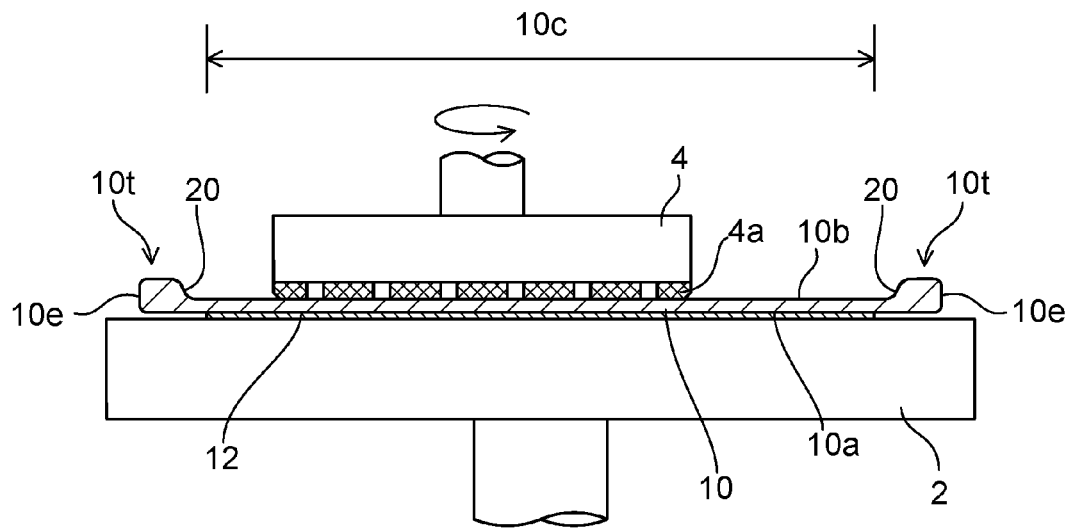
FIG. 3 is a view showing one step of the manufacturing method of the semiconductor element, showing how the semiconductor wafer 10 is ground from a second main surface 10b side.

Next, as shown in FIG. 3, the semiconductor wafer 10 is turned over, and the semiconductor wafer 10 is ground from a second main surface 10b side, for example, by a grinding head 4 having a plurality of grinding stones 4a. Due to this, a thickness of the central region 10e of the semiconductor wafer 10 is adjusted to a thickness required for the semiconductor element. Here, in order to secure a strength of the semiconductor wafer 10, a region along the outer circumferential surface 10e of the semiconductor wafer 10 is left without being ground. As a result, a thick region 10t having a thickness greater than the thickness of the central region 10e is formed along the outer circumferential surface 10e of the semiconductor wafer 10. At this occasion, a slope surface 20 is further formed between the central region 10c and the thick region 10t on the second main surface 10b of the semiconductor wafer 10. Details of the slope surface 20 will be described later. At this stage, in the second main surface 10b of the semiconductor wafer 10, the thick region 10t protrudes in a frame-like manner, and a height difference is generated between the central region 10c and the thick region 10t. The slope surface 20 extends between the central region 10e and the thick region 10t in a ring shape along a circumferential direction of the semiconductor wafer 10.

Figure 4:
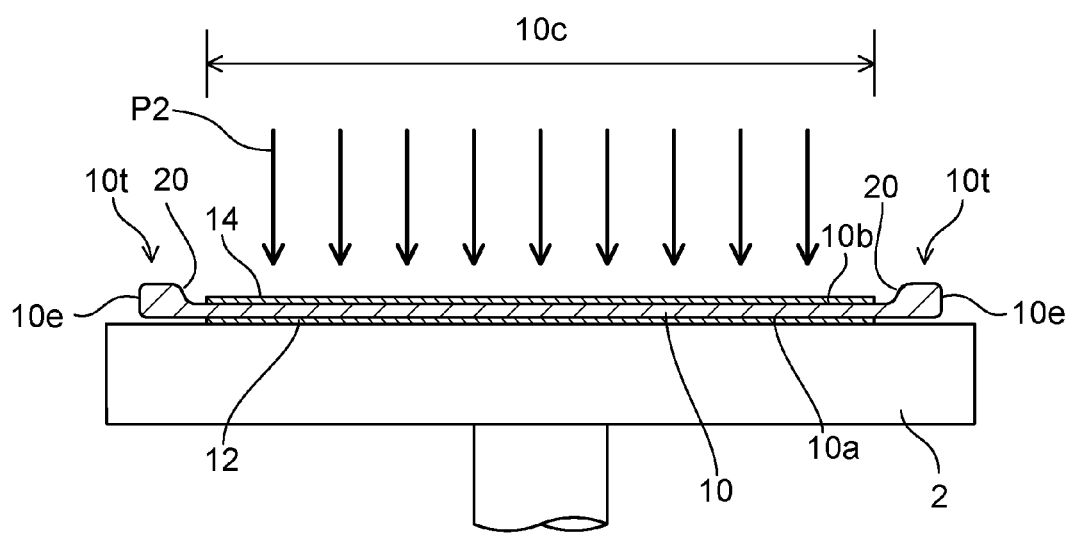
FIG. 4 is a view showing one step of the manufacturing method of the semiconductor element, showing how a partial structure of the semiconductor element is formed from the second main surface 10b side of the semiconductor wafer 10.
Figure 5:
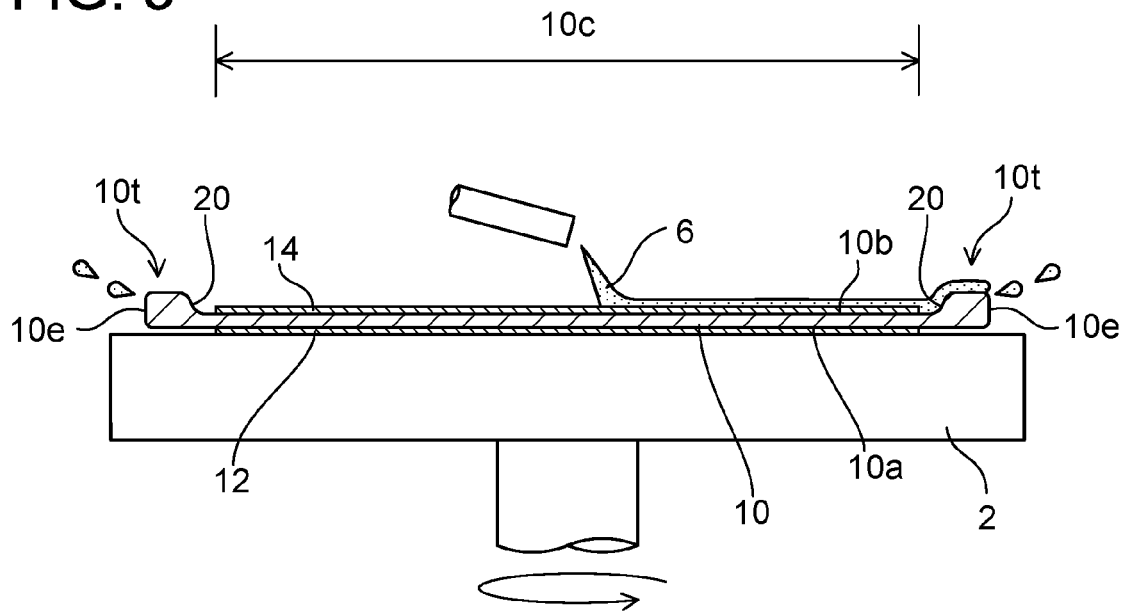
FIG. 5 is a view showing one step of the manufacturing method of the semiconductor element, showing how chemical solution 6 is used.

Next, as shown in FIG. 4, another partial structure of the semiconductor element is further formed in the central region 10c of the semiconductor wafer 10. In this step, for example, ion implantation of n-type or p-type conductive impurities and formation of a second electrode layer 14 to serve as another main electrode of the semiconductor element are mainly performed from the second main surface 10b side of the semiconductor wafer 10. It should be noted that the specific processes performed in this step are not particularly limited, and necessary processes may be performed according to the structure of the semiconductor element. Arrows P2 in FIG. 4 schematically show various kinds of processes that can be performed in this step, and do not indicate any specific process. Here, as shown in FIG. 5, various kinds of chemical solution 6 are used, for example, in formation of a mask through a photoresist in manufacturing of the semiconductor element. The chemical solution 6 is removed from the semiconductor wafer 10 by using a centrifugal force generated by a rotation of the stage 2.

Finally, the semiconductor wafer 10 is diced such that individual semiconductor elements are cut out therefrom.

As described above, in the process of manufacturing the semiconductor element, the thick region 10t being greater in thickness than the central region 10c is formed along the outer circumferential surface 10e on the second main surface 10b of the semiconductor wafer 10. By forming the thick region 10t, the central region 10c of the semiconductor wafer 10 can be processed thin while securing the strength of the semiconductor wafer 10. However, when the semiconductor wafer 10 is ground while forming the thick region 10t on the semiconductor wafer 10 (see FIG. 3), there is a problem that chippings are likely to occur in the semiconductor wafer 10. Further, there is also a problem that, if the thick region 10t is formed on the semiconductor wafer 10, when the chemical solution 6 is used in the process of manufacturing the semiconductor element (see FIG. 5), the chemical solution 6 is likely to remain on the second main surface 10b of the semiconductor wafer 10.

Figure 6:
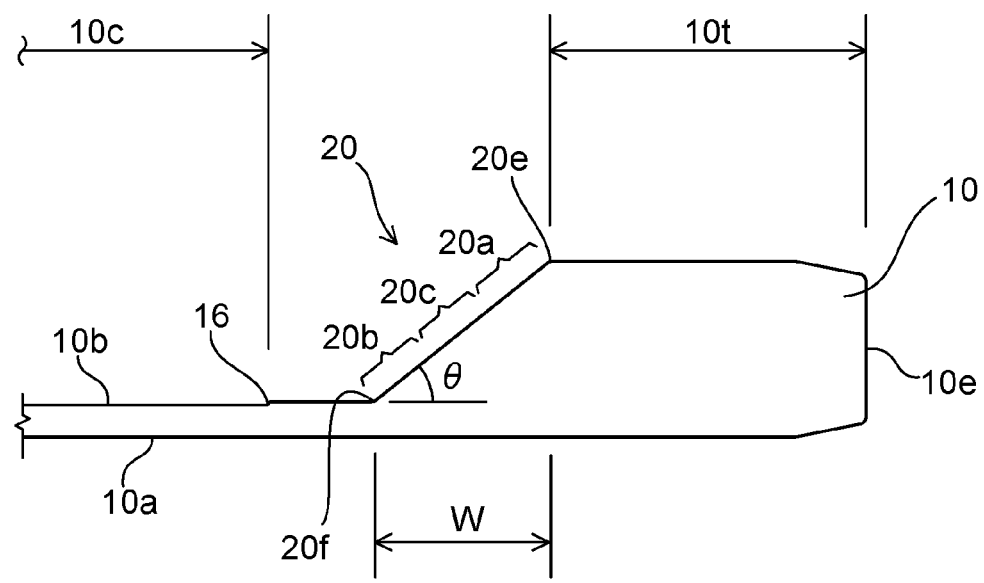
FIG. 6 is a view for explaining a structure of a slope surface 20.

With respect to the above problems, the slope surface 20 is formed between the central region 10c and the thick region 10t on the second main surface 10b of the semiconductor wafer 10. As shown in FIG. 6, the slope surface 20 has an inner circumferential edge 20f positioned on a central region 10 side and an outer circumferential edge 20e positioned on a thick region 10t side. The slope surface 20 slopes such that the thickness of the semiconductor wafer 10 increases from the inner circumferential edge 20f toward the outer circumferential edge 20e. In the slope surface 20 shown in FIG. 6, a slope angle θ is constant from the inner circumferential edge 20f to the outer circumferential edge 20e. It should be noted that a minute step 16 shown in FIG. 6 is a step generated when a surface of the central region 10c is finished smooth and flat.

Figure 7:
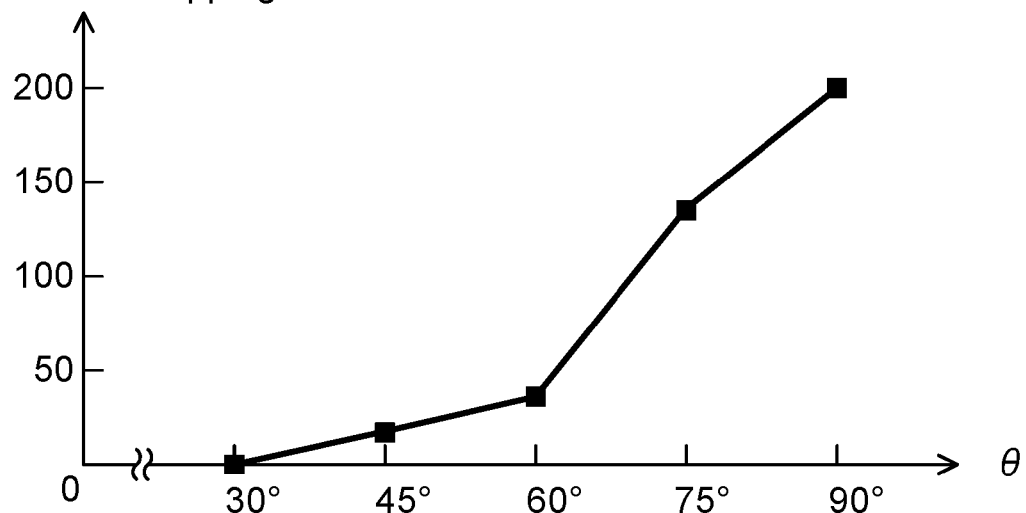
FIG. 7 is experimental data showing a relationship between a slope angle θ of the slope surface 20 and a number of chippings.

According to studies of the present inventors, it was proved that by providing the slope surface 20 between the central region 10c and the thick region 10t, the chippings of the semiconductor wafer 10 were suppressed and as the slope angle θ of the slope surface 20 became small, the effect of suppressing the chippings was enhanced. FIG. 7 shows an example of experimental results by the present inventors, and shows a relationship between the slope angle θ of the slope surface 20 and a number of chippings occurred. In this experiment, the slope angle θ was changed between 30 degrees, 45 degrees, 60 degrees, 75 degrees, and 90 degrees, as a result of which it was confirmed that the number of chippings decreased as the slope angle θ became small.

Figure 8:
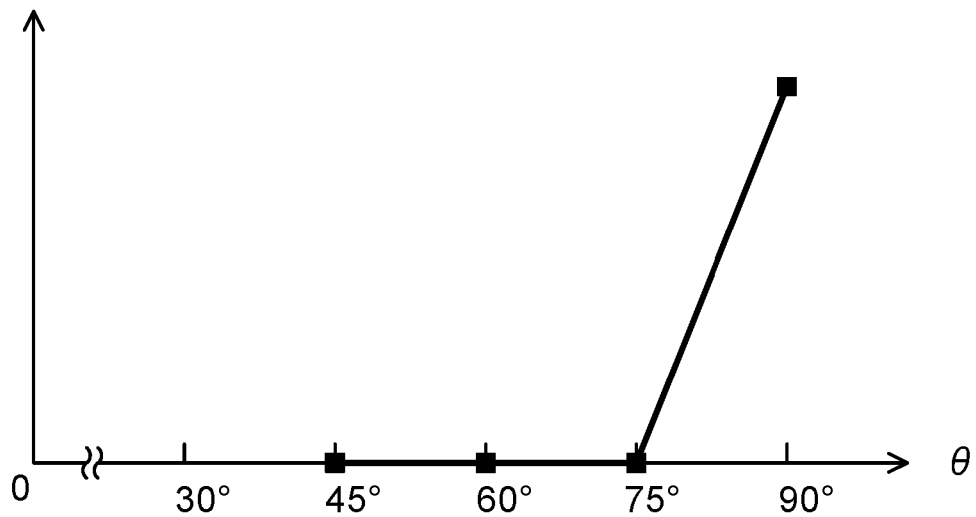
FIG. 8 is experimental data showing a relationship between the slope angle θ of the slope surface 20 and a residual amount of the chemical solution 6.

Further, according to the studies conducted by the present inventors, it was also proved that by providing the slope surface 20 between the central region 10c and the thick region 10t, the residue of the chemical solution 6 was suppressed, and the effect of suppressing the residue of the chemical solution 6 was enhanced as the slope angle θ of the slope surface 20 became small. FIG. 8 shows an example of experimental results by the present inventors and shows a relationship between the slope angle θ of the slope surface 20 and the residual amount of the chemical liquid 6. In this experiment, as a result of changing the slope angle θ between 45 degrees, 60 degrees, 75 degrees, and 90 degrees, it was confirmed that the residual amount of the chemical solution 6 decreased as the slope angle θ became small. In this experiment, it was confirmed that when the slope angle θ was set to be equal to or smaller than 75 degrees, the residual amount of the chemical solution 6 became zero. It should be noted that the slope angle θ at which the residual amount of the chemical solution 6 becomes zero can change according to a type, properties, and a supplying amount of the chemical solution 6, a rotation speed and time of the stage 2, and/or a material and/or size of the semiconductor wafer 10.

According to the above-described experimental results, it is preferable that the slope angle θ of the slope surface 20 is small, and thereby the above-described effects of the slope surface 20 can be enhanced. However, if the slope angle θ of the slope surface 20 is reduced to become smaller, a width dimension W of the slope surface 20 (dimension of the slope surface 20 in a radial direction of the semiconductor wafer 10) becomes wide, and an area of the central region 10c or the thick region 10t decreases. As the area of the central region 10c decreases, a number of semiconductor elements that can be manufactured from one semiconductor wafer 10 decreases. As the area of the thick region 10t decreases, the strength of the semiconductor wafer 10 weakens.

The present inventors further advanced the research on the above-mentioned trade-off problem, and obtained the following findings. The chipping of the semiconductor wafer 10 mainly occurs at the outer circumferential edge 20e of the slope surface 20 and in a vicinity thereof (that is, an outer circumferential portion 20a including the outer circumferential edge 20e). Thus, by decreasing a slope angle θ1 of the outer circumferential portion 20a of the slope surface 20, even if slope angles θ2, θ3 of other portions 20b, 20c of the slope surface 20 are made relatively large, the chipping of the semiconductor wafer 10 can be suppressed significantly. On the other hand, the residue of the chemical solution 6 mainly occurs at the inner circumferential edge 20f of the slope surface 20 and in a vicinity thereof (that is, the inner circumferential portion 20b including the inner circumferential edge 20f). Thus, by decreasing the slope angle θ2 of the inner circumferential portion 20b of the slope surface 20, even if the slope angles θ1, θ3 of the other portions 20a, 20c of the slope surface 20 are made relatively large, the residue of the chemical solution 6 can be suppressed significantly. In this way, if the slope angle θ of the slope surface 20 is not made constant and at least one of the slope angles θ1, θ2 of the outer circumferential portion 20a and the inner circumferential portion 20b is made smaller than a slope angle θ3 of the intermediate portion 20c, at least one of the above-mentioned effects of the slope surface 20 can be enhanced while suppressing the increase in the width dimension W of the slope surface 20.

Figure 9:
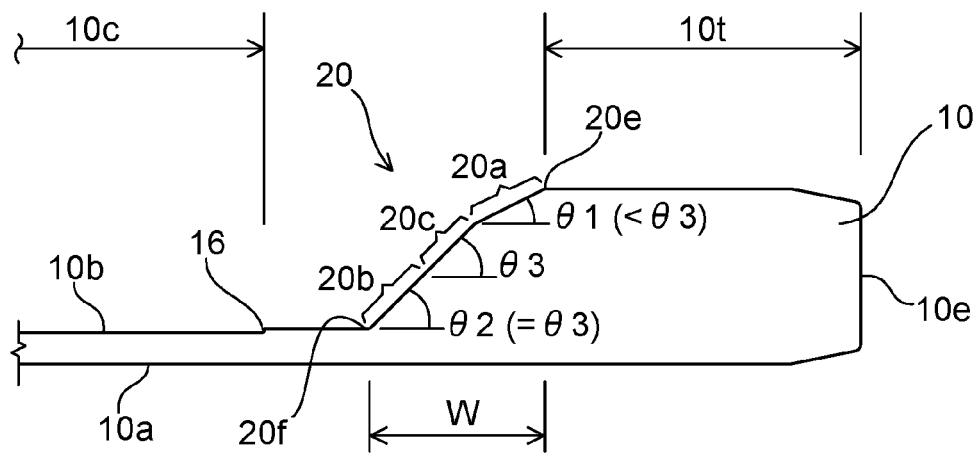
FIG. 9 is a view showing an example of the slope surface 20 in which a slope angle θ1 of an outer circumferential portion 20a is made smaller than a slope angle θ3 of an intermediate portion 20c.

In an example of the slope surface 20 shown in FIG. 9, the slope angle θ1 of the outer circumferential portion 20a is smaller than the slope angle θ3 of the intermediate portion 20c. According such a configuration, the effect of the slope surface 20 suppressing the chippings can be enhanced while suppressing the increase in the width dimension W of the slope surface 20. Further, the slope angle θ2 of the inner circumferential portion 20b can be made equal to the slope angle θ3 of the intermediate portion 20c. According to such a configuration, for example, since the inner circumferential portion 20b and the intermediate portion 20c can be formed by the grinding stones 4a of the same shape, it is possible to avoid complicating the manufacturing process of the semiconductor element. However, as another embodiment, the slope angle θ2 of the inner circumferential portion 20b may be larger than the slope angle θ3 of the intermediate portion 20c.

Figure 10:
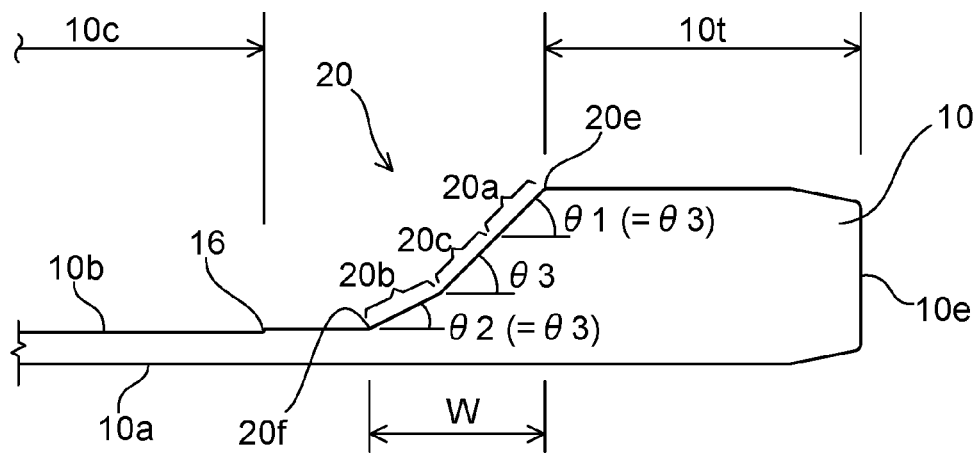
FIG. 10 is a view showing an example of the slope surface 20 in which a slope angle θ2 of an inner circumferential portion 20b is made smaller than the slope angle θ3 of the intermediate portion 20c.

In a slope surface 20 of another example shown in FIG. 10, the slope angle θ2 of the inner circumferential portion 20b is smaller than the slope angle θ3 of the intermediate portion 20c. According to such a configuration, the effect of suppressing the residue of the chemical solution 6 by the slope surface 20 can be enhanced while suppressing the increase in the width dimension W of the slope surface 20. Further, the slope angle θ1 of the outer circumferential portion 20a can be made equal to the slope angle θ3 of the intermediate portion 20c. According to such a configuration, for example, since the outer circumferential portion 20a and the intermediate portion 20c can be formed by the grinding stones 4a of the same shape, it is possible to avoid complicating the manufacturing process of the semiconductor element. However, as another embodiment, the slope angle θ1 of the outer circumferential portion 20a may be larger than the slope angle θ3 of the intermediate portion 20c.

Figure 11:
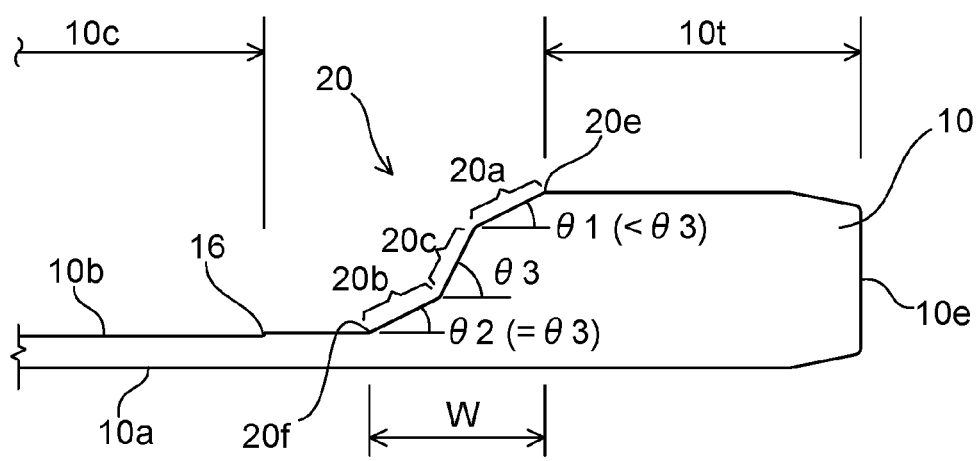
FIG. 11 is a view showing an example of the slope surface 20 in which both of the slope angles θ1 and θ2 of the outer circumferential portion 20a and the inner circumferential portion 20b are made smaller than the slope angle θ3 of the intermediate portion 20c.

In another example of a slope surface 20 shown in FIG. 11, the slope angles θ1, θ2 of both the outer circumferential portion 20a and the inner circumferential portion 20b of the slope surface 20 are smaller than the slope angle θ3 of the intermediate portion 20c of the slope surface 20. According to such a configuration, while suppressing the increase in the width dimension W of the slope surface 20, both of the effect of suppressing the chippings by the slope surface 20 and the effect of suppressing the residue of the chemical solution 6 by the slope surface 20 can be enhanced.

Figure 12:
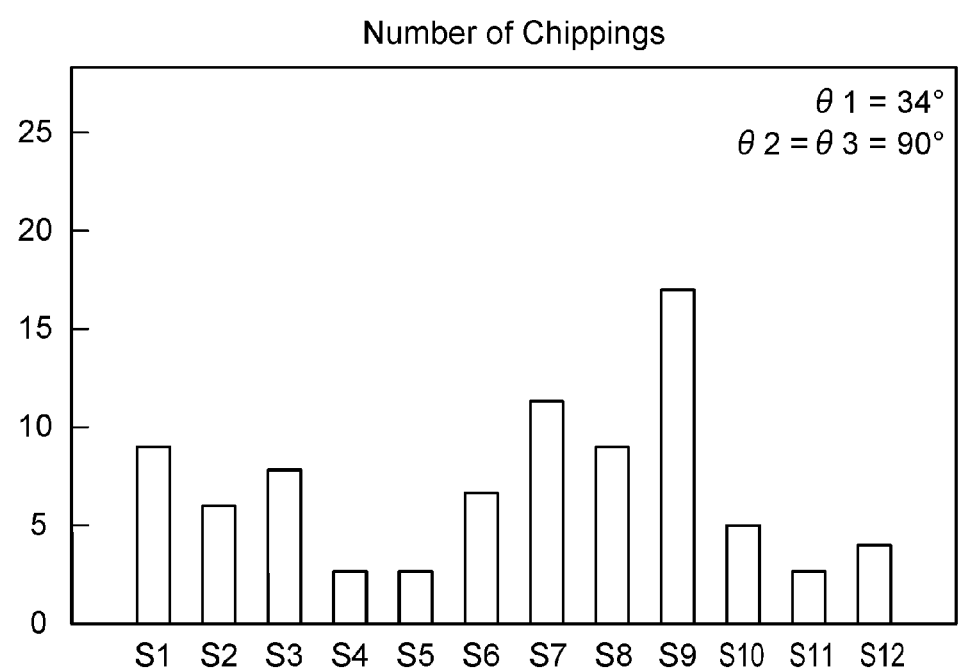
FIG. 12 is experimental data showing an effect for suppressing the chippings for the example of the slope angle 20 shown in FIG. 9.

FIG. 12 is a graph indicating experimental data by which the effect of suppressing the chipping for the slope surface 20 according to the embodiment shown in FIG. 9 was confirmed. In this experiment, the slope angle θ1 of the outer circumferential portion 20a of the slope surface 20 was set to 34 degrees, the slope angles θ2 and 03 of the inner circumferential portion 20b and the intermediate portion 20c were set to 90 degrees. Although the slope angles θ2 and θ3 of the inner circumferential portion 20b and the intermediate portion 20c are usually set to degrees smaller than 90 degrees, in this experiment the slope angles θ2 and θ3 of the inner circumferential portion 20b and the intermediate portion 20c were set to 90 degrees which are most disadvantageous, in order to clarify an effect obtained in a case where only the slope angle θ1 of the outer circumferential portion 20a is made small. Samples S1 to S12 of twelve semiconductor wafers 10 were manufactured under the above-described conditions, and a number of chippings having a dimension of 50 micrometers or more was counted for each of the samples S1 to S12. As shown in FIG. 12, it was confirmed that an average number of chippings occurred among the twelve samples S1 to S12 was seven, which is within an acceptable range. It should be noted that the experimental data shown in FIG. 12 is an example, and a number of chippings can change, for example, depending on a material and/or dimension of the semiconductor wafer 10.

In the slope surfaces 20 exemplified in FIGS. 9, 10 and 11, each of the slope angles θ1, θ2, and θ3 is not limited to a specific angle. Each of the slope angles θ1, θ2, and θ3 may be set to any value within a range of smaller than 90 degrees. Further, although in the examples of FIGS. 9, 10 and 11 only one slope surface is provided between the central region 10c and the thick region 10t, two or more slope surfaces 20 may be provided between the central region 10c and the thick region 10t with a space therebetween. In this case, the structure exemplified in any of FIGS. 9, 10 and 11 may be employed for at least one of the slope surfaces 20. Further, although in the slope surfaces 20 exemplified in FIGS. 9, 10 and 11 the outer circumferential surface portion 20a, the intermediate portion 20c, and the inner circumferential surface portion 20b are arranged continuously, another portion having another slope angle may be provided between the outer circumferential portion 20a and the intermediate portion 20e and/or between the intermediate portion 20c and the inner circumferential portion 20b.

What is claimed is:

1. A semiconductor wafer comprising:
a central region in a planer view; and
a thick region extending along an outer circumferential surface of the semiconductor wafer in the planer view, the thick region being greater in thickness than the central region,
wherein one of main surfaces of the semiconductor wafer comprises a slope surface located between the central region and the thick region,
the slope surface comprises: an inner circumferential edge located on a side of the central region; and an outer circumferential edge located on a side of the thick region, the slope surface sloping such that the thickness of the semiconductor wafer increases from the inner circumferential edge to the outer circumferential edge,
the slope surface comprises: an inner circumferential portion including the inner circumferential edge; an outer circumferential portion including the outer circumferential edge; and an intermediate portion located between the inner circumferential portion and the outer circumferential portion, and
at least one of a slope angle of the inner circumferential portion and a slope angle of the outer circumferential portion is smaller than a slope angle of the intermediate portion.

2. The semiconductor wafer according to claim 1, wherein the slope angle of the outer circumferential portion is smaller than the slope angle of the intermediate portion.

3. The semiconductor wafer according to claim 2, wherein the slope angle of the inner circumferential portion is equal to the slope angle of the intermediate portion.

4. The semiconductor wafer according to claim 1, wherein the slope angle of the inner circumferential portion is smaller than the slope angle of the intermediate portion.

5. The semiconductor wafer according to claim 4, wherein the slope angle of the outer circumferential portion is equal to the slope angle of the intermediate portion.

6. The semiconductor wafer according to claim 1, wherein both the slope angle of the inner circumferential portion and the slope angle of the outer circumferential portion are smaller than the slope angle of the intermediate portion.

7. A method for manufacturing a semiconductor element, comprising:
forming a partial structure of the semiconductor element within a central portion of a semiconductor wafer in a planer view;
forming a thick region that extends along an outer circumferential surface of the semiconductor wafer in the planer view by grinding the central portion from one of main surfaces of the semiconductor wafer, the thick region being greater in thickness than the central region; and
forming another partial structure of the semiconductor element within the central portion of the semiconductor wafer from the one of the main surfaces of the semiconductor wafer,
wherein the forming the thick region further forms a slope surface located between the central region and the thick region on the one of the main surfaces of the semiconductor wafer,
the slope surface comprises: an inner circumferential edge located on a side of the central region; and an outer circumferential edge located on a side of the thick region, the slope surface sloping such that the thickness of the semiconductor wafer increases from the inner circumferential edge to the outer circumferential edge,
the slope surface comprises: an inner circumferential portion including the inner circumferential edge; an outer circumferential portion including the outer circumferential edge; and an intermediate portion located between the inner circumferential portion and the outer circumferential portion, and
at least one of a slope angle of the inner circumferential portion and a slope angle of the outer circumferential portion is smaller than a slope angle of the intermediate portion.

* * * * *